United States Patent [19]

Seki et al.

[11] Patent Number: 5,180,465
[45] Date of Patent: Jan. 19, 1993

[54] ETCHING METHOD OF FORMING MICROCIRCUIT PATTERNS ON A PRINTED CIRCUIT BOARD

[75] Inventors: Kameharu Seki; Shin Kawakami; Isamu Kubo, all of Saitama, Japan

[73] Assignee: Nippon CMK Corp., Japan

[21] Appl. No.: 734,203

[22] Filed: Jul. 22, 1991

[51] Int. Cl.$^5$ .......................... B44C 1/22; C23F 1/00
[52] U.S. Cl. ................... 156/640; 156/656; 156/659.1; 156/666; 156/345; 156/901
[58] Field of Search ............ 156/640, 656, 659.1, 156/666, 901, 902, 345; 134/3, 32, 34, 64 R, 122 R, 198; 252/79.1, 79.2, 79.3, 79.4, 79.5

[56] References Cited

U.S. PATENT DOCUMENTS 3,935,041  1/1976  Goffredo et al. ............... 156/640
4,917,758  4/1990  Ishizuka et al. ................ 156/630
5,071,508  12/1991  Scheithauer et al. ........... 156/627

FOREIGN PATENT DOCUMENTS 2-211691  8/1990  Japan .................. 156/640

OTHER PUBLICATIONS

Butora et al., "Circuit Etching Process", IBM Technical Disclosure Bulletin, vol. 12, No. 9, Feb. 1970, p. 1515.

Primary Examiner—William A. Powell
Attorney, Agent, or Firm—Bruce L. Adams; Van C. Wilks

[57] ABSTRACT

An etching method of forming circuit patterns on a printed circuit board is disclosed. The etching method comprises step of supplying etching solvent with discharge pressure of substantially 5~10 kg/cm$^2$ and discharge particle diameter of 100~200 μm.

6 Claims, 2 Drawing Sheets

ETCHING METHOD OF FORMING MICROCIRCUIT PATTERNS ON A PRINTED CIRCUIT BOARD

BACKGROUND OF THE INVENTION

The present invention relates to an etching method of forming circuit patterns, particularly, microcircuit patterns on a printed circuit board.

A conventional etching method for forming microcircuit patterns on a printed circuit board is performed by utilizing an etching solvent of water solution including cupric chloride, ferric chloride, persulfate, and hydrogen peroxide, sulfuric acid and alkali solvent or the like, with the discharge pressure of the etching solvent from the nozzle being made very low, and with the spraying pressure of the etching solvent being $1 \sim 3$ kg/cm$^2$.

In the above conventional etching method, the printed circuits are formed with a large flow amount of etching liquid, such as a low discharge pressure of $1 \sim 3$ kg/cm$^2$ and a discharge flow rate of $8 \sim 10$ lt/min. In this case, balance of etching becomes worse on the upper surface of the printed circuit board, resulting in a residue of etching on the upper surface thereof, and an over-etching on the lower surface of the printed circuit board, thereby loosening the printed circuits from the printed circuit board. Therefore, at present, it is difficult to carry out the stable and uniform etching method in case of forming the printed circuits having width of 0.1 mm or less.

SUMMARY OF THE INVENTION

It is an object of the present invention to overcome the above described disadvantages of the conventional method of forming microcircuit patterns on a printed circuit board.

It is another object of the present invention to provide an etching method suitable for forming microcircuit patterns on a printed circuit board.

According to the present invention, there is provided an etching method of forming circuit patterns on a printed circuit board comprising the step of supplying etching solvent with discharge pressure of substantially $5 \sim 10$ kg/cm$^2$ and discharge particle diameter of $100 \sim 200$ μm.

The etchant solvent is a water solution including cupric chloride, ferric chloride, persulfate, and hydrogen peroxide, sulfuric acid, and alkali etchant or the like. The distance between the nozzles for spraying etching liquid or water on the printed circuit board and the printed circuit board is $50 \sim 150$ mm.

According to the present invention, the discharge pressure is made high, the discharge flow amount is decreased and the distance the workpiece becomes to be required particle diameter, so that the fine pattern of width of, for example, less than 100 μm can be formed with the half of the conventional required time, and thus the patterns on both sides of the printed circuit board can be etched away evenly, thereby improving producibility and yield.

DETAILED EXPLANATION OF THE PREFERRED EMBODIMENT

Figure 1:
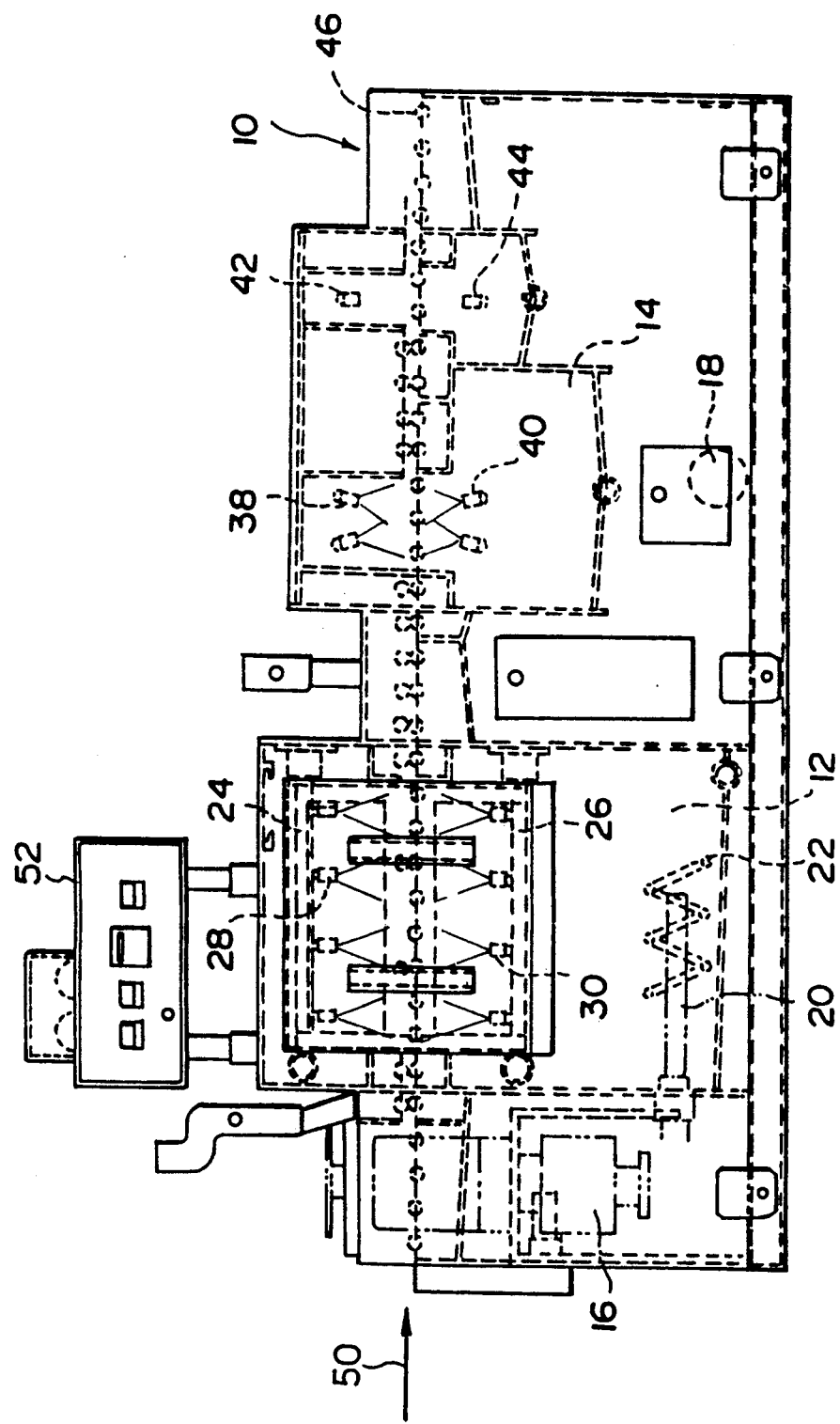
FIG. 1 is a side view showing an embodiment of an etching apparatus for carrying out a method of forming circuit patterns on a printed circuit board according to the present invention.

Now to the drawings, there is shown an embodiment of an etching apparatus for carrying out a method of forming circuit patterns on a printed circuit board according to the present invention. Like parts are shown by corresponding reference characters throughout the several views of the drawings.

Figure 2:
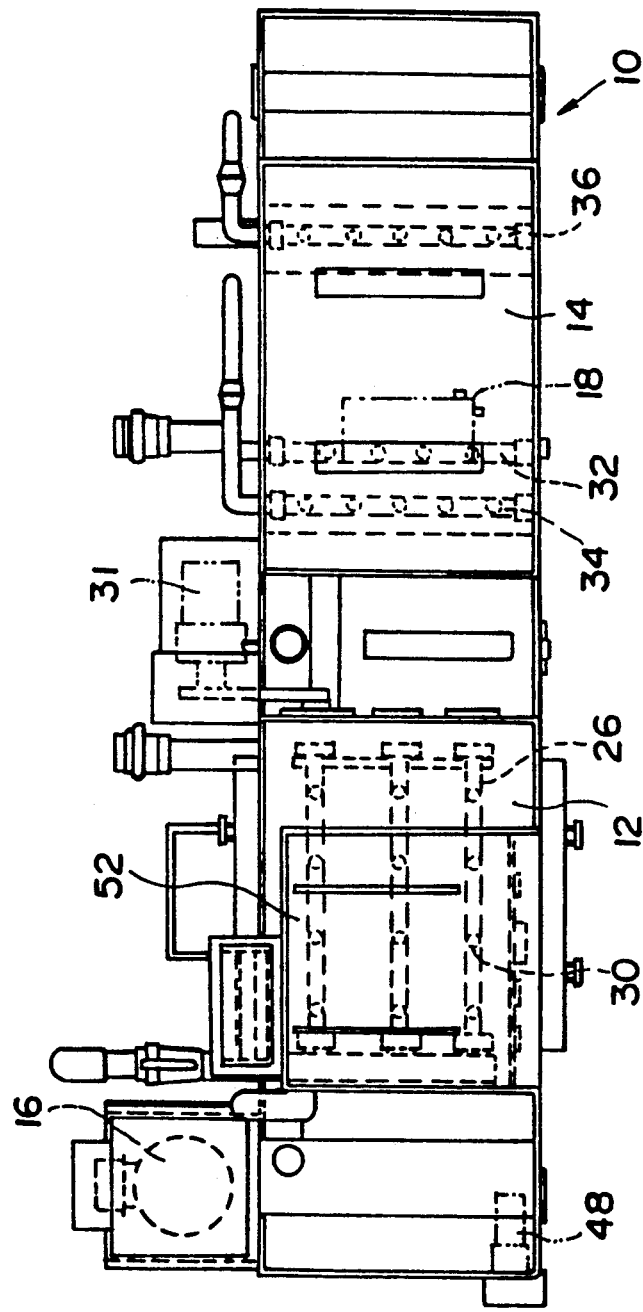
FIG. 2 is a plan view showing the etching apparatus for forming circuit patterns on a printed circuit board according to the present invention.

FIGS. 1 and 2 are, respectively, a side view and a plan view showing an embodiment of an etching apparatus for carrying out an etching method of forming circuit patterns on a printed circuit board according to the present invention. The etching apparatus comprises a solvent tank 12 and a water tank 14 which are defined in a body 10 of a metal sheet. These tanks 12 and 14 are communicated to an etching pump 16 and a rinsing pump 18, respectively. The solvent tank 12 accommodates a heater element 20 and a cooling pipe 22 therein, so as to hold the temperature of the liquid to a constant value. An etching solvent of comparatively high pressure, $5 \sim 10$ kg/cm$^2$ is supplied to an upper nozzle 28 and a lower nozzle 30 through manifolds 24 and 26, respectively, from the etching pump 16. Manifolds 28 and 30 are swung by a predetermined angle by an oscillating motor 31 to spray the solvent or the water on a surface of the printed circuit board.

At the same time, an amount of water flow is supplied to a first and a second nozzle 38, 40, 42 or 44 from the rinsing tank 18 through manifolds 32, 34 and 36, respectively.

A roller conveyer 46 is driven by a conveyer motor 48 through a transmission device (not shown) to convey a copper clad laminate for forming the printed circuit board horizontally in the direction of an arrow 50 in the body 10.

An operation of the etching apparatus according to the present invention is explained.

A copper foil is provided on a base plate for the printed circuit board and then an etching photoresist layer is provided on the copper foil. Then, a given mask is covered on the photoresist layer and the mask is exposed by the ultraviolet rays to print the pattern of the etching photoresist and then unexposed portions of the etching photoresist are rinsed and etched away and thus the pattern on the copper foil is coated by the photoresist, thereby exposing another portion thereof. In this way, the thus formed printed circuit board is subjected to an etching process by the use of the etching apparatus according to the present invention to etch away the space between the required circuits.

These printed circuit boards are continuously supplied to a conveyer 46 from its inlet in the direction of an arrow 50. The etching liquid is heated or cooled to a given temperature by the heater 20 and the cooling pipe 22 provided in the solvent tank 12, and is sprayed from the manifolds 28 and 30 through the etching pump 16, as well as manifolds 24 and 26. In this case, the spraying direction of the nozzle 28 and 30 is changed by swaying the manifolds 24 and 26 with the oscillating motor 31. If the printed circuit board has a circuit on one side, the upper nozzle 24 is stopped to operate, and if the printed circuit board has circuits on both sides, both nozzle 24 and 26 are operated. The control of these nozzle operations is performed by a control board or console 52.

According to the present invention, the etching liquids to be used are of water solution including cupric chloride, ferric chloride, persulfate, and hydrogen peroxide, sulfuric acid, and alkali etchant or the like. The discharge pressure of the etching pump 16 is 5~10 kg/cm$^2$, the particle diameter of the discharge fluid is 100~200 μm and the distance between the printed circuit board and the nozzles 28 and 30 is 50~150 mm.

According to the present invention, therefore, the very high discharge pressure comparative with the conventional etching method is utilized to make the discharge particle diameter very small, so that the etching liquid is reached to the space between the circuits of fine or microcircuit, thereby obtaining uniform etching with short time. The flow rate of the etching liquid is very small and the amount of the etching liquid flowing on the surface of the printed circuit board is also less and then the spraying of high pressure liquid from the nozzle is completely reached at the portion to be etched irrespective of the amount of liquid on the surface of the printed circuit board.

After the etching is finished, the printed circuit boards are conveyed to the rinsing station by a conveyer 46 and rinsed by the water flow from the rinsing pump 18 through the first and second rinsing nozzle 38, 40; 42, 44. The printed circuit board conveyed from the outlet of the conveyer is dried in a drying device (not shown).

What is claimed is:

1. An etching method of forming circuit patterns on a printed circuit board, comprising:
   supplying etching solvent from a solvent pump at a discharge pressure of substantially 5-10 kg/cm$^2$ and a discharge particle diameter of 100-200 μm.

2. An etching method of forming circuit patterns on a printed board as claimed in claim 1, wherein the etching solvent is a water solution including cupric chloride, ferric chloride, persulfate, hydrogen peroxide, sulfuric acid, and alkali etchant.

3. An etching method of forming circuit patterns on a printed circuit board as claimed in claim 1, wherein the etching solvent is supplied by nozzles and the distance between the nozzles and the printed circuit board is 50-150 mm.

4. A method of forming a circuit pattern on a printed circuit board, comprising: supplying etching solvent onto a printed circuit board with a pressure of 5 to 10 kg/cm$^2$ and a particle diameter of 100 to 200 μm.

5. A method according to claim 4, wherein the etching solvent comprises a water solution including cupric chloride, ferric chloride, persulfate, hydrogen peroxide, sulfuric acid and alkali etchant.

6. A method according to claim 4, wherein the etching solvent is supplied to the printed circuit board from a distance of from 50 to 150 mm.

* * * * *